United States Patent [19]

Gorny

[11] Patent Number: 5,642,061

[45] Date of Patent: Jun. 24, 1997

[54] SHORT CIRCUIT CURRENT FREE DYNAMIC LOGIC CLOCK TIMING

[75] Inventor: Douglas J. Gorny, Felton, Calif.

[73] Assignee: Hitachi America, Ltd., Tarrytown, N.Y.

[21] Appl. No.: 423,540

[22] Filed: Apr. 17, 1995

[51] Int. Cl.[6] ............................................. H03K 19/096
[52] U.S. Cl. ................................................ 326/97; 326/98
[58] Field of Search ................................. 326/95, 97–98

[56] References Cited

U.S. PATENT DOCUMENTS

| | | | |
|---|---|---|---|
| 4,565,934 | 1/1986 | Sutherland | 326/97 |
| 4,700,086 | 10/1987 | Ling et al. | 326/98 |
| 4,827,160 | 5/1989 | Okano | 326/97 |
| 5,144,163 | 9/1992 | Matsuzawa | 326/98 |
| 5,329,176 | 7/1994 | Miller, Jr. | 326/97 |
| 5,378,942 | 1/1995 | Wu | 326/97 |
| 5,453,708 | 9/1995 | Gupta | 326/98 |

*Primary Examiner*—Edward P. Westin
*Assistant Examiner*—Benjamin D. Driscoll
*Attorney, Agent, or Firm*—Flehr Hohbach Test Albritton & Herbert LLP

[57] ABSTRACT

An apparatus and method for providing short circuit current free dynamic logic building blocks comprising P-logic and N-logic dynamic domino building blocks having separate clocks for driving the P-logic and N-logic evaluate and pre-charge stages. The P-logic building gates are pre-charged to a zero volt output and upon the transition from high to low on the input line, will provide a high output during the evaluation cycle. Conversely, the N-logic building blocks are pre-charged with a high output level and upon the transition of a low to high input to the building block device, will provide a low output signal during the evaluation period. Both building block types are pre-charged again at the end of the evaluation period to provide an inherently glitch-free dynamic logic device. Separate evaluate and charge clock signals are provided to each of the P-logic and N-logic building blocks which are configured to provide a non-overlapping charge and evaluation cycle. The active portions of the pre-charge, evaluate cycles, and the transitions between are made mutually exclusive. A static latch is provided for use in DC operations upon shut off of the charge clock. In an alternative embodiment, a dynamic latch is provided for use in a minimal frequency clocking embodiment of the dynamic building blocks where charge cycles are sufficiently frequent to compensate for charge decay.

10 Claims, 7 Drawing Sheets

Vin = steady state logic high, with hi-lo transitions during the evaluate cycle

300

Vin = steady state logic lo, with lo-hi transitions during the evaluate cycle

400

SHORT CIRCUIT CURRENT FREE DYNAMIC LOGIC CLOCK TIMING

This invention relates to logic circuits, and specifically, to a NP domino logic circuit implementing dynamic logic clock timing for providing glitch-free and short circuit current-free building blocks for use in logic circuits.

BACKGROUND OF THE INVENTION

The present invention provides an improvement over traditional NP domino logic techniques by providing dynamic clock signal timing in order to eliminate short circuit current flow. In the preferred embodiment, the static inverters utilized between logic blocks when implementing traditional NP domino logic circuit design techniques have been eliminated allowing for simpler cascading of the domino building blocks for various logic circuits.

Logic designers utilize various design styles to create logical building blocks which are optimized for a given environment. For example, some logic design styles are directed to preventing race conditions between devices, other design styles take advantage of low power techniques, still other design styles are directed to minimizing power dissipation in a particular circuit.

Power dissipation is a performance measure that refers to the amount of heat energy that is dissipated by a given device during the operation of the device. As a device operates, heat energy is generated. This heat energy is due to the basic operation of the device as gates are switched from state to state, as well because of design defects in the device. If too much heat is built up in the device, the circuit may fail or operate unpredictably. As such, the logic circuit designer must either dissipate the heat energy by means of heat sinks and the like, adding to the cost and overall complexity of the logic circuit design, or minimize its generation or effect in the logic circuit. In terms of efficiency, ideally designers would opt for minimizing the amount of heat energy to be dissipated by eliminating any unnecessary switching, thereby saving on power consumption. This is especially important in portable electronic devices which operate on a finite battery supply. The present invention is directed to a logic design technique which is utilized to minimize power consumption and necessarily the heat energy required to be dissipated by a given circuit by eliminating short circuit current flow in each logic building block.

Heat energy may be created in a logic circuit, inter alia, due to short circuit current flow or glitches. Short circuit current flow will arise if care is not taken as to the sequencing of switching in the device. Specifically, logic circuits which utilize PMOS and NMOS chains often have short circuit current flow as complementary switches transition from state to state. Accordingly, short circuit current power dissipation refers to the amount of power that is dissipated due to short circuit conditions in the logic circuit.

Glitches arise due to race conditions in logic gates, where extra switching occurs due to multi-state transitions during a single clock cycle. Glitch power dissipation refers to the amount of heat energy that is dissipated due to hazard transitions or glitches that arise due to unnecessary switching of the logic devices. In CMOS VLSI circuits, it has been shown that short circuit current can account for as much as 10% of the total power dissipated by a given circuit. Similarly, glitch power dissipation has been shown to be up to 15–20% of the total power dissipated by a CMOS VLSI circuit.

In the prior art, certain design techniques have been utilized to eliminate the need for dissipating glitch power. One such design technique involves the use of a clocked dynamic logic style. In a clocked dynamic logic style, inputs to each gate are switched at most once per clock cycle. In this way, glitch power dissipation is not required by a circuit implementing this technology.

Referring first to FIG. 1, a prior art static logic building block for use in a logic design circuit is shown. The building block 100 is comprised of a PMOS field effect transistor (FET) 102 whose source is tied to a Vcc input, and whose drain is tied to the source of an NMOS FET 104. The drain of the NMOS transistor 104 is coupled to a ground. An input signal 106 is coupled to the gate inputs of both PMOS FET 102 and NMOS FET 104. As such, as the input Vin 106 swings from high to low, the PMOS FET 102 will conduct driving a high signal out on the Vout signal line 108. Conversely, as the V input signal 106 is driven from low to high, the PMOS FET 102 will no longer conduct, while the NMOS FET 104 will begin to conduct thereby driving a ground to the output signal line Vout 108.

As configured, the input swings of Vin and Vout may cause a condition to arise in the FETs 102 and 104, whereby both FET 102 and 104 are on at the same time. In the event that both FET 102 and 104 are on at the same time, a short circuit current flow will arise as the VCC is conducted through the two transistor devices directly to ground. The short circuit current condition arises because the same input signal Vin is used to both turn on and off the complementary FETs 102 and 104. As such, during a transition period between the on and off states, both FETs 102 and 104 will conduct causing a short circuit current to flow.

Referring now to FIG. 2, an example of a prior art glitch free logic technique which implements pre-charge logic is shown. "Pre-charge" logic refers to a logical building block device which has its output pre-charged during one clock cycle (the charge cycle) and thereafter during a second cycle (the evaluation cycle) the status of the input signal to the logic block is evaluated. In this type of circuit technique, the input signal (Vin) is limited to a single transition during the evaluation period.

In this prior art design technique, a building block 200 comprised of a PMOS FET 202 whose source is coupled to VCC and whose drain is coupled to the source of a second PMOS FET 204. The second PMOS FET 204 has its drain coupled to a source input of an NMOS FET 206 whose drain is coupled to ground. In this glitch-free circuit, a first clock signal, Vclk 208 is connected as an input to the gate inputs of PMOS FET 202 and NMOS FET 206. Finally, an input signal Vin 210 is coupled to the gate input of the second PMOS FET 204 whose drain forms the output Vout 212 for this building block circuit 200. This type of circuit utilizes a pre-charge and evaluate clock phase in order to evaluate the status of the input signal Vin.

The clocking diagram is shown in FIG. 2b. For this type of device, the input signal Vin is held at a constant high and, upon a transition from a high to a low state, will drive the output of the building block from a low to a high state. During a charge cycle, the clock line is held high causing PMOS FET 202 to turn off and NMOS FET 206 to turn on. When NMOS FET 206 turns on, a ground is provided on the output signal line Vout 212. As such the building block is "pre-charged" to a logical low output level. During the second portion of the clock cycle, the evaluation cycle, the clock is held low thereby causing the NMOS FET 206 to turn off and the PMOS FET 202 to conduct. When the PMOS FET 202 conducts, the VCC signal is driven to the source input of the PMOS FET 204. As such, if the input signal Vin transitions from a high to low, the second PMOS FET 204 will conduct driving a high VCC output signal on the signal output line Vout 212. Upon the end of the evaluation period, a charge cycle will re-occur causing the output to again be driven to ground.

In this type of dynamic clocked environment, the input signal Vin is only allowed to switch one time during the evaluation phase. As long as this condition is satisfied, then the output signal Vout will transition only a single time during a clock cycle. Those ordinarily skilled in the art will recognize that the reason why the input signal must only be allowed to transition one time during the evaluation phase is because the capacitive nature of the output signal line, Vout 212. In operation, upon transition from a high to a low state on the Vin input signal line, a high output state would result as described above. If the input signal were to transition back to high during the evaluation cycle, the output signal line Vout would remain in the high output state due to the capacitive nature of the output signal line irrespective of the input signal until the capacitive elements in the output signal line were discharged into some load. As such, if the input signal line Vin 210 is allowed to toggle during the evaluation phase, the output signal line Vout 212 will not reflect a true state of the input signal. By requiring a single transition during the evaluation phase, the circuit as shown in FIG. 2a provides for a glitch-free power dissipation because no switching of the devices occur due to race considerations.

However, as can be seen in FIG. 2a, because a single clock signal Vclk 208 is used to drive both the PMOS FET 202 and the NMOS FET 206, a short circuit current condition may arise during the transition phase between the turn on and turn off of FETs 202 and 206. This condition will arise when, at the end of an evaluation period, the input signal remains in the low state causing FET 204 to conduct. During the transition from the end of the evaluation period, FET 202 will turn off while FET 206 begins to turn on. As such, the cascading of the three FETs 202, 204, and 206 will result in a short circuit current during this transition period. While the circuit shown in FIG. 2a provides for a glitch-free logic building block, short circuit current power dissipation still must be compensated for by circuits implementing building blocks as shown in FIG. 2a.

Other dynamic logic techniques including NORA make use of this glitch-free property of dynamic clock circuit timing. Still other designs including Zipper CMOS have been implemented which provide the same basic race or glitch-free environments. However, the majority of the modifications to these basic NP domino techniques have been made to combat charge sharing problems associated with cascading a plurality of building blocks together.

SUMMARY OF THE INVENTION

It is an object of the present invention to provide a dynamic logic building block having separate pre-charged and evaluation clocks to allow for the elimination of short circuit current flows in logic building block.

It is the further object of the present invention to provide a short circuit current free static latch for maintaining the input signal to a dynamic logic building block in a steady state during the precharge clock cycle for DC operation.

It is another object of the present invention to provide a short circuit current free dynamic latch for maintaining the last state input to a dynamic logic building block when operating the dynamic logic building block at frequencies high enough that capacitive charges built up between stages of the building block do not decay between charges.

The apparatus of the present invention comprises P-logic and N-logic dynamic domino building blocks having separate clocks for driving the P-logic and N-logic evaluate and pre-charge stages. The P logic building gates are pre-charged to a zero volt output and upon the transition from high to low on the input line, will provide a high output during the evaluation cycle. Conversely, the N-logic building blocks are pre-charged with a high output level and upon the transition of a high to low input to the building block device, will provide a low output signal during the evaluation period. Both building block types are pre-charged again at the end of the evaluation period to provide an inherently glitch-free dynamic logic device. Separate evaluate and charge clock signals are provided to each of the P-logic and N-logic building blocks which are configured to provide a non-overlapping charge and evaluation cycle. In this configuration, no short circuit current will arise during the transition between the charge and the evaluation cycle for either of the building block devices. By using four separate clocks for P-logic pre-charge, P-logic evaluate, N-logic pre-charge, and N-logic evaluate, the short circuit current can be eliminated. The active portions of the pre-charge, evaluate cycles, and the transitions between are made mutually exclusive. That is, the pre-charge for the N and the P-logic end, and are completely off, before the evaluate for each building block begins to transition.

In an alternative embodiment, a static latch is provided for use with the dynamic logic building blocks during DC operations where the clocking may be shut off in the precharge state. In another alternative embodiment, a dynamic latch is provided for use with the dynamic logic building blocks during minimal frequency operations where the frequency of charge cycles is sufficient to prevent the decay of the capacitive charge built up between the stages of the building blocks.

BRIEF DESCRIPTION OF THE DRAWINGS

Additional objects and features of the invention will be more readily apparent from the following detailed description and appended claims when taken in conjunction with the drawings, in which:

FIG. 2b is a timing diagram for the device of FIG. 2a.

FIG. 3b is a timing diagram for the device of FIG. 3a.

DESCRIPTION OF THE PREFERRED EMBODIMENT

Figure 1:
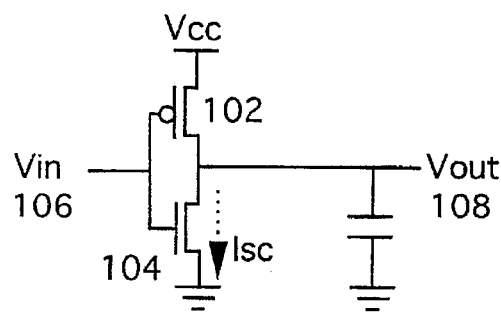
FIG. 1 is a prior art static logic building block.
Figure 2A:
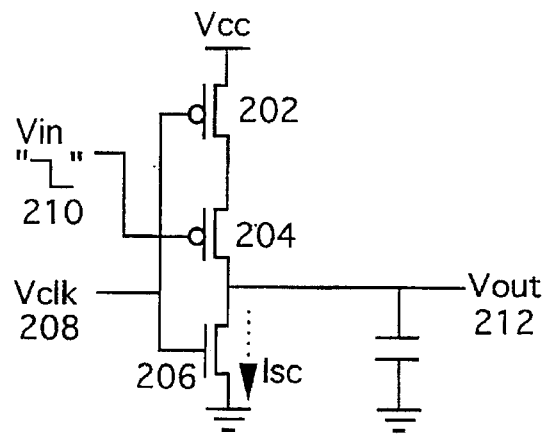
FIG. 2a is a prior art dynamic logic building block.
Figure 2B:
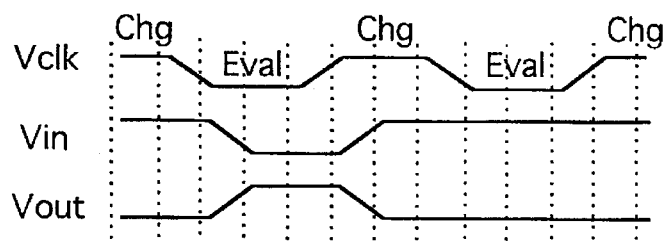
Figure 3A:
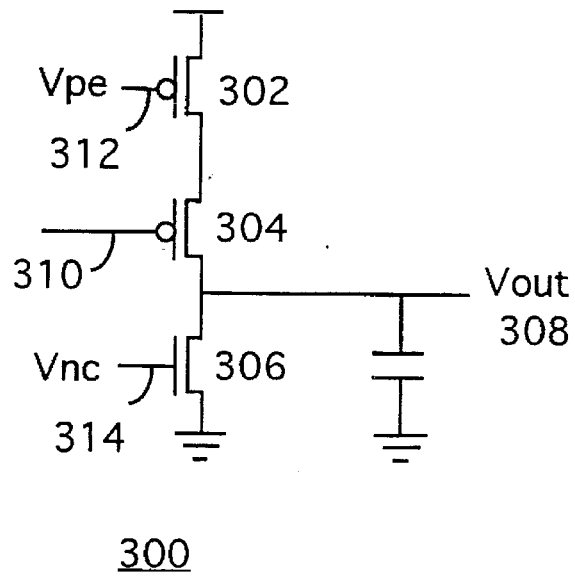
FIG. 3a shows a P-logic dynamic domino logic block according to the preferred embodiment of the present invention.

Referring first to FIG. 3a, a P-logic building block 300 incorporating the teaching of the present invention is shown. The P-logic building block 300 includes a PMOS FET 302 having its source tied to VCC and its drain tied to the source of a second PMOS FET 304. The second PMOS FET 304 has its drain connected to the source of a NMOS FET 306 and also forms the tap point for the output signal line Vout 308. The gate input for the second PMOS FET is coupled to an input signal Vin 310. The first PMOS FET 302 has its input coupled to a first clock signal Vpe 312 which is the PMOS evaluate clock. The NMOS FET 306 has its gate input coupled to a second clock signal Vnc 314, which is the NMOS charge clock. During the charge cycle, the input to FET 306 is held high (Vnc=high) thereby driving the output Vout 308 to ground. In the preferred embodiment, the input signal Vin 310 for a P-logic building block device is held at a steady state high level and transitions to low during the evaluation period. Thereafter, the input signal is held constant through the remainder of the evaluation cycle allowing only for a single transition from the high to low state during the evaluation time period. This input restriction allows for the proper evaluation logic function and is standard for dynamic logic devices.

Figure 3B:
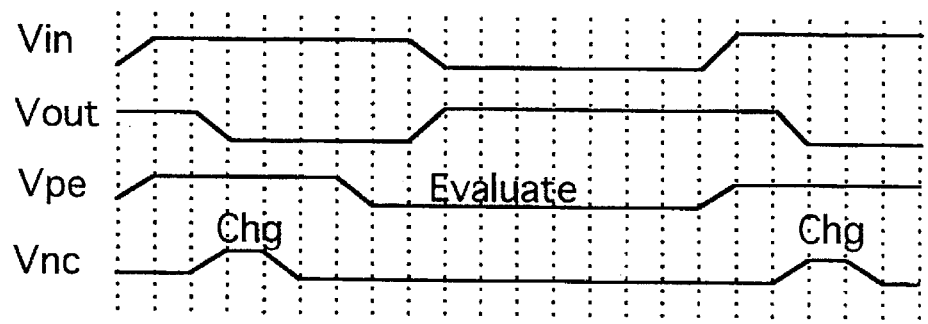

Referring now to FIG. 3b, the clocking relationship between the Vpe evaluation clock and the Vnc charge cycle clock and the input signal is shown. In operation, the Vnc charge clock is transitioned from low to high during the charge cycle thereby providing for a low output voltage as described previously on the output of the building block device 308. The charge cycle will thereafter end resulting in a capacitive hold of the low voltage signal value at the output until the start of the evaluation cycle. After some time period $\Delta T_1$ ($\Delta T_1 > 0$) after the end of the charge cycle (when the Vnc signal=0), the evaluation cycle begins. The evaluation cycle commences in the P-logic device by transitioning the Vpe evaluation clock 312 from a high state to a low state to be held low during the entire evaluation cycle. This low signal on the gate input to P-logic FET 302 causes the device to conduct thereby providing for a connection from the source of FET 304 to VCC through the conductive channel of FET 302. Accordingly, the output signal Vout 308 will swing from a low to a high value upon an input signal transition from a high to low state. As described previously, the input signal to the building block device is held for P-logic devices to a high signal level and transitions to a low signal level during the evaluation phase. Upon the occurrence of a transition from high to low in the input signal, the output line will swing from low to high reflecting this change of state of the input signal.

Upon the end of the evaluation cycle (the evaluation signal line Vpe will transition from a low state back to a high state), a second time period $\Delta T_2$ ($\Delta T_2 > 0$) will elapse and thereafter, a new charge cycle can be initialized. The new charge cycle may be initialized only upon the completion of the evaluation phase, thereby providing for no short circuit current flow to arise between the PMOS and NMOS chains in the P-logic and N-logic devices.

In the P-logic building block 300, the output node is pre-charged to low, 0 volts, using the Vnc clocking signal 314. Once the pre-charge is finished and the Vnc signal is low, the Vpe evaluation clock signal 312 will begin to go low after some time delay $\Delta T_1$. In the preferred embodiment, the $\Delta T_1$ time delay can be any time period>0. However, those ordinarily skilled in the art will recognize that for time periods greater than the decay time associated with the capacitance for the output circuit, a static latching means will have to be provided in order to maintain the output state at a pre-defined charge level in anticipation of the next input signal.

As the P-logic evaluation clock signal Vpe 312 goes low, the P-logic function is evaluated and the output may be discharged to high on the output signal line Vout 308, depending on the input Vin 310. As was described previously, the inputs during this time may only transition from high to low. Those ordinarily skilled in the art will recognize this input restriction allows for proper evaluation of the logic function and is standard for dynamic logic.

Once the evaluation is finished, the evaluation clock signal Vpe 312 will return to the high state turning off the evaluation of the P-logic. Once the evaluation clock signal Vpe is completely high, the charge clock signal Vnc will be allowed to go high after some second time delay $\Delta T_2$. As was described previously, the high level input signal on the charge clock Vnc will cause the output of the P-logic section to be pre-charged to a low voltage level. During the period of time where the charge signal clock Vnc is high, it is possible for the inputs to switch back from their low input state to a high state in order to satisfy the traditional high input signal level required into the P-logic device. Those ordinarily skilled in the art will recognize that this is proper and has no affect on the logic function because the P chain is off due to the clock signal Vpe 312 being in a high state. Those ordinarily skilled in the art will recognize that if the time period $\Delta T_2$ between the P-logic going inactive and the pre-charge PMOS FET going active is greater than zero, then no short circuit current will flow when switching from pre-charge to evaluate with the P-logic. Thus, P-logic is short circuit, current free by design.

Figure 4:
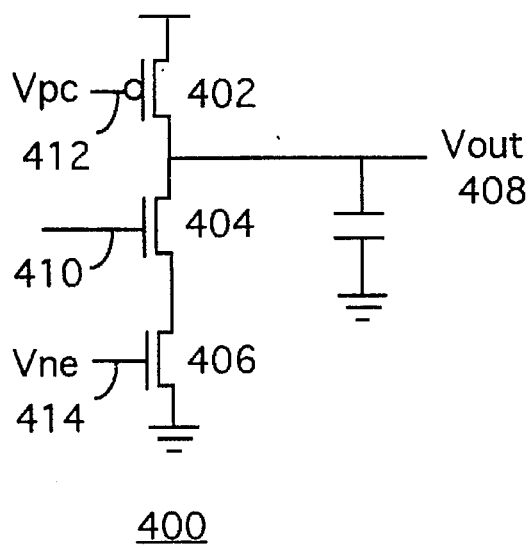
FIG. 4 shows an N-logic dynamic domino logic block according to the preferred embodiment of the present invention.

Referring now to FIG. 4, an N-logic building block 400 is shown. The N-logic building block comprises a PMOS FET 402 whose source is coupled to a VCC signal and whose drain is coupled to the source of a first NMOS FET 404. The drain of the first NMOS FET 404 is in turn coupled to the source of a second NMOS FET 406 whose drain is coupled to ground. An output signal line is tapped between the source and drain of PMOS FET 402 and first NMOS FET 404 providing for an output signal Vout 408 for the logic block. A first charge clock Vpc 412 is coupled to the gate input to the PMOS FET 402. A second clock signal, the evaluation clock signal, Vne 414 is coupled to the gate input of the second NMOS FET 406. Finally, an input signal Vin 416 is coupled to the gate input of the first NMOS FET 404.

In operation, the N-logic output node is pre-charged to high using the charge clocking signal Vpc 412. This is accomplished by driving the Vpc signal line low thereby causing the PMOS FET 402 to conduct, resulting in a VCC high signal level on the output signal line Vout 408. Once the pre-charge is finished, the charge signal line Vpc 412 returns to high and the evaluation clock signal Vne 414 will begin to go high after some time delay $\Delta T_1$. In the preferred embodiment, the time delay is greater than zero, but should be made less than the decay time for the output capacitance associated with the output load on the output signal line. As the evaluation signal Vne 414 goes high, the N-logic function is evaluated and the output may be discharged from high to low depending on the value of the input. As was described in conjunction with the P-logic device, the input signal Vin may only make transitions (from low to high) during the evaluation clock cycle.

In the N-logic devices, the input signals are held low in the steady state and then transition one time during the evaluation period to a high state to indicate a state change. If during the evaluation period this transition occurs, then the output signal line Vout 408 will transition from a high to low logic state. Those ordinarily skilled in the art will recognize the input restriction allows for proper evaluation of the logic function and is standard for dynamic logic.

Upon the end of the evaluation period, the evaluation clock signal Vne will go back to a low state, causing the complete turn off of the evaluation NMOS FETs 404 and 406. Once the evaluation clock signal Vne is completely low, the charge clock signal Vpc will go low after a second time delay $\Delta T_2$. During the charge low cycle, the inputs Vin to the building block may be switched back from a high to a low state, providing the low input value that is required for this type of building block. This transition has no effect on the logic function because the NMOS chain 404 and 406 is off during the charge cycle by holding the evaluation clock signal Vne low.

Just as the case with the P-logic section, if the time between the pre-charge going inactive and the N-logic becoming active $\Delta T_1$ is greater than zero, no short circuit current will flow when switching from pre-charge to evaluate with the N-logic. Also, if the time between the N-logic evaluate going inactive and the P precharge going active $\Delta T_2$ is greater than zero, there will be no short circuit current when in transition from the evaluate back to the pre-charge using N-logic. Thus, the N-logic is also short circuit current free by design.

Figure 5:
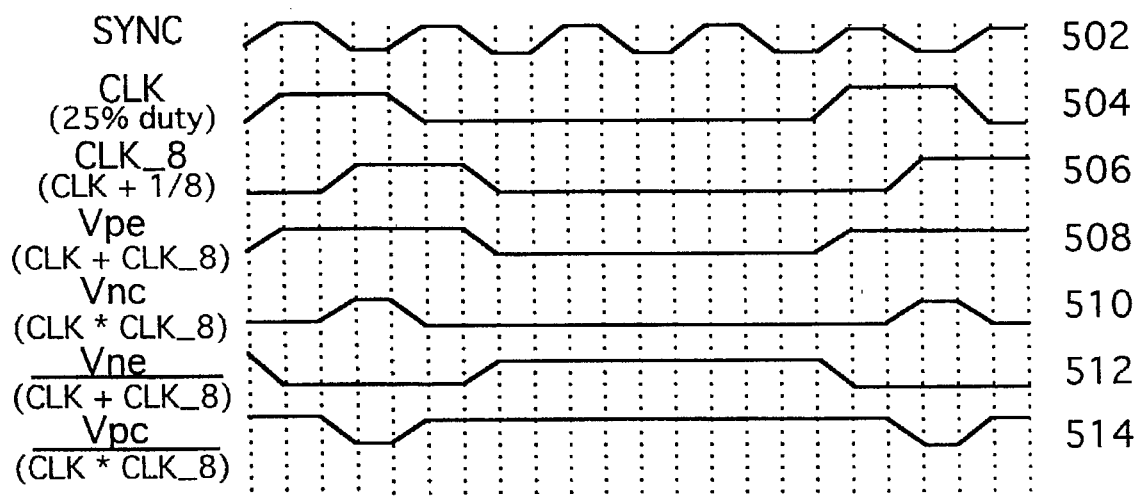
FIG. 5 shows a clocking diagram associated with the four separate clock inputs for the P-logic and N-logic building blocks according to the preferred embodiment of the present invention.

Referring now to FIG. 5, the clocking signals used in the preferred embodiment of the present invention are shown. An input clock signal Sync 502 is utilized to generate a second clock signal Clk 504 which has a 25% duty at one-quarter of the frequency of Sync 502. A third clocking signal Clk_8 504 is a phase shifted version of Clk 504. From these three signals Sync 502, Clk 504, and Clk_8 506, the clocking signals Vpe, Vne, Vpc, and Vnc can be generated. In the preferred embodiment, the Vpe clocking signal is generated by logical "OR"ing the Clk 504 and the Clk_8 506 signals. The Vnc signal is generated by logical "NOR"ing the Clk 504 and the Clk_8 506 signals. Clocking signals Vne and Vpc are merely the inverse of the Vpe and the Vnc signals, respectively.

Figure 6:
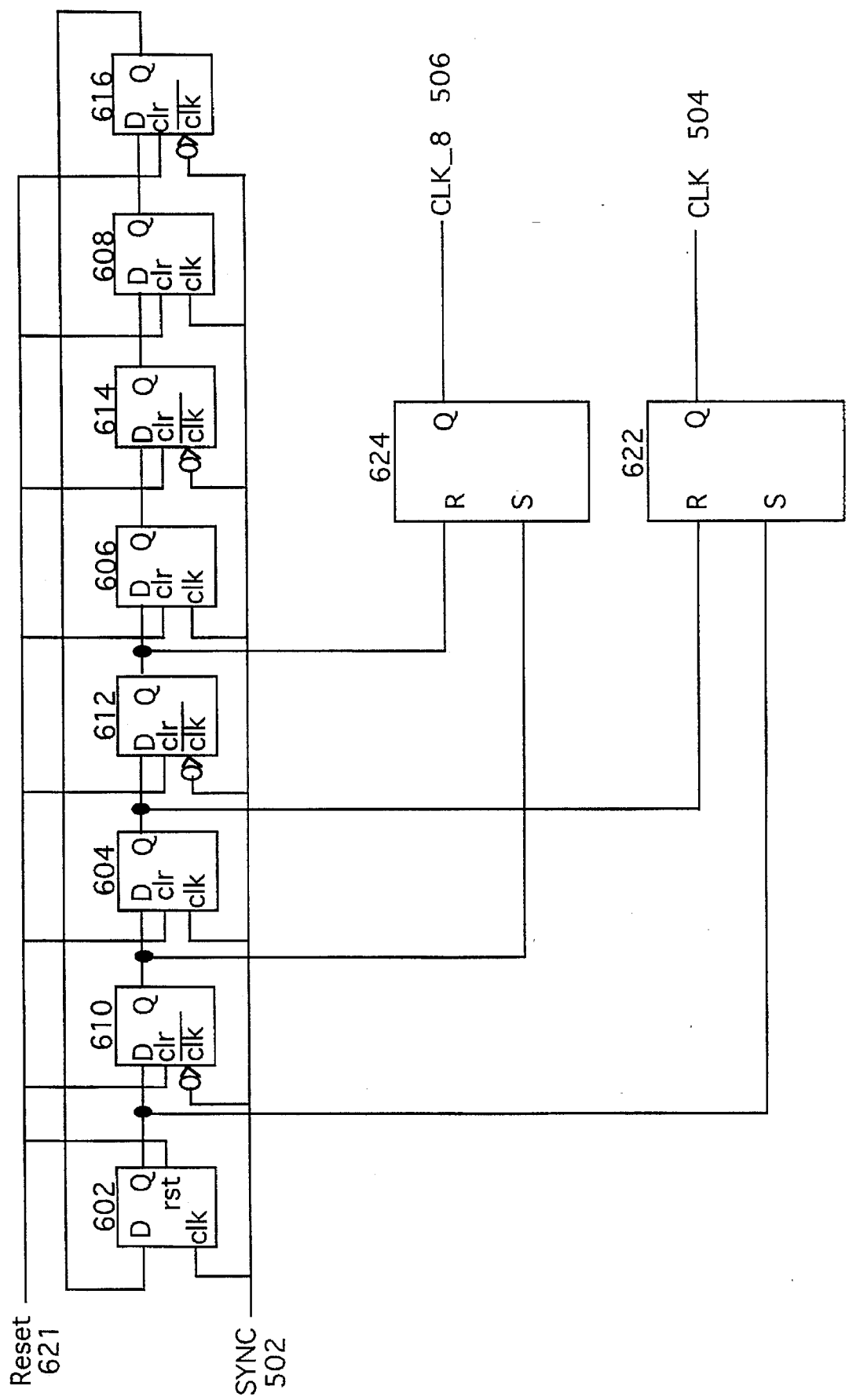
FIG. 6 shows a block diagram of a clock circuit for generating clock signals for use in the preferred embodiment of the present invention.

Referring now to FIG. 6, a block diagram is shown for generating the Clk 504 and Clk_8 506 clocking signals from a given input signal SYNC for use in deriving the four clocking signals used in the preferred embodiment of the present invention. Four positive edge triggered latches 602, 604, 606, and 608 are coupled with four negative edge triggered latches 610, 612, 614, and 616 by having the output of a positive triggered latch feed the input of the next negative triggered latch, while the respective output of each of the negative triggered latches is, in turn, coupled to the input of an adjoining positive edge triggered latch. The output from latch 614 is coupled to the input of latch 602 thereby creating a feedback network for producing the clocking signals required by the preferred embodiment of the present invention. A first input signal Sync 620 is provided as the input to the clock ports for each of the positive edge triggered latches 602, 604, 606, and 608 as well as to the clock input port of the negative edge triggered latches 610, 612, 614, and 616. A reset signal 621 is provided as an input to the reset signal port of latch 602, and to the clear port of each of the latches 604, 606, 608, 610, 612, 614 and 616. The reset signal is generated at initialization of the logic circuit in order to synchronize the subsequently generated other clock source signals (504 and 506). In the preferred embodiment, the reset signal 621 sets the output of latch 602 to a logical "1" and simultaneously sets the output of the remaining latches 604, 606, 608, 610, 612, 614 and 616 to a logical "0".

The output of the first positive edge triggered latch 602 is coupled to the set input of an SR flip-flop 622 whose reset input is, in turn coupled to the output of the second positive edge triggered latch 604. The output of the SR flip-flop 622 forms the Clk 504 output signal. A second SR flip-flop 624 has its set input coupled to the output of the first negative edge triggered latch 610 and reset input coupled to the output of the second negative edge triggered flip-flop 612. The output of the second SR flip-flop 624 forms the Clk_8 506 signal for use by the preferred embodiment of the present invention. Finally, by the use of logical NOR, OR and inverter gates, the Vpe, Vne, Vpc, and Vnc signals are derived. Those ordinarily skilled in the art will recognize that the latching means and flip-flops described are a simple way of implementing the necessary clock signals utilized in the preferred embodiment of the present invention. However, other means may be utilized as is known in the art.

In operation, the N-logic short circuit current-free logic blocks as shown in FIG. 4 are configured to receive a low level input signal that transitions from low to a high state during the evaluation period. Upon the occurrence of a low to high transition during the evaluation phase, the output of a N-logic block will transition from a high level to a low logic level. If no low to high transition occurs during the evaluation period, then the output of the N-logic device will remain at a constant high output level. Conversely, the P-logic short circuit current-free logic blocks as shown in FIG. 3 require a high input signal that transitions from a high to low level during the evaluation phase. In operation, the P-logic device requires a high to low level transition during the evaluation phase to cause the output of the P-logic device to transition from a low logic level to a high logic level. If no high to low logic level input transition occurs, then the output of the P-logic device remains at a low logic level. Accordingly, P-logic devices provide a perfect input signal to N-logic devices because of their low level pre-charged output level. Conversely, the N-logic device provides a perfect input to the P-logic device because of its constant high level output as a result of the pre-charge for the N-logic device. In this way, the P-logic and N-logic devices may be cascaded alternately with N-logic devices feeding P-logic devices to form more complex logic structures.

Figure 7A:
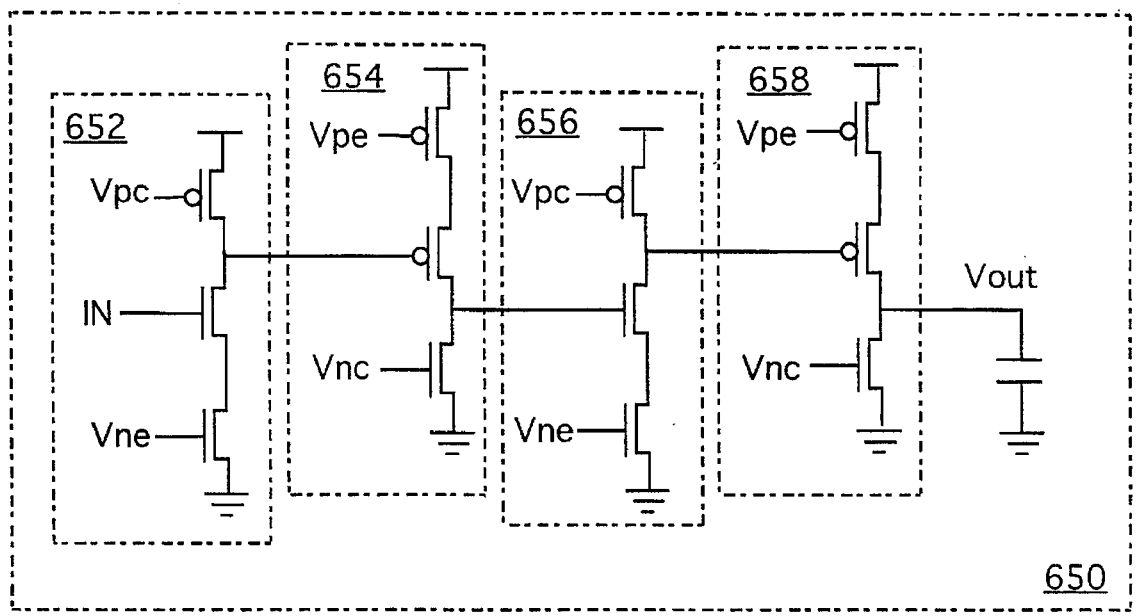
FIG. 7a shows a cascaded device incorporating alternating N-logic and P-logic building blocks according to the preferred embodiment of the present invention.

Referring now to FIG. 7a, a cascaded device 650 incorporating alternating N-logic and P-logic building blocks is shown. A first N-logic device 652 is coupled to P-logic device 654, which in turn is coupled to a second N-logic device 656 whose output is coupled to a second P-logic device 658. Cascaded structures such as these may be utilized in various digital logic circuits such as custom LSI's, DSPs, and micro processors.

In order to cascade the N-logic and P-logic devices, care must be taken in maintaining the input levels at their pre-charge state for the entire duration of an evaluation phase in the event no transition occurs in the input signal. This may be accomplished by utilizing the capacitance associated with the output stage in the individual logic block, however, these capacitively stored values will decay after some time requiting a minimum frequency for the clocks. A latch may be used between the logic building devices so as to store the intermediate data states thereby maintaining the high level or low level input signals required by the individual N-logic and P-logic devices, respectively.

Figure 7B:
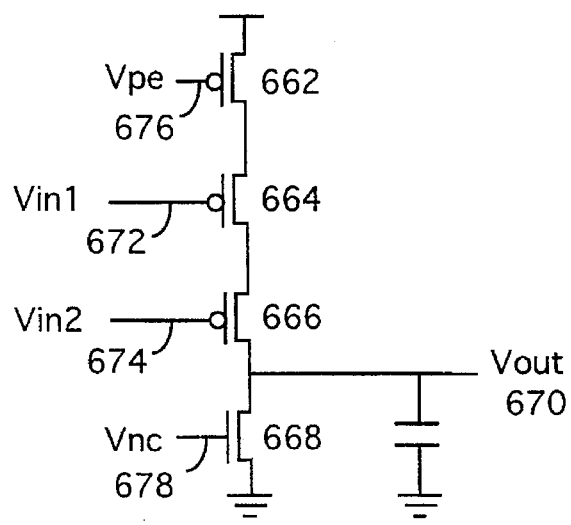
FIG. 7b shows a P-logic NOR gate type dynamic domino logic block according to the preferred embodiment of the present invention.

Those ordinarily skilled in the art will recognize that the teachings of the present invention may be incorporated in more complex logic building blocks than the invertor gates shown in FIGS. 3 and 4. Invertor gates were chosen for illustration purposes only, and the logic design technique disclosed can work equally well with other logical devices such as AND, NAND, NOR, OR, and XOR gates. Referring now to FIG. 7b, a P-logic NOR gate according to the preferred embodiment of the present invention is shown. As shown, the P-logic NOR gate building block includes a PMOS FET 662 having its source tied to VCC and its drain tied to the source of a second PMOS FET 664. The drain of the second PMOS FET 664 is in turn tied to the source of a third PMOS FET 666. The third PMOS FET 666 has its drain connected to the source of a NMOS FET 668 and also forms the tap point for the output signal line Vout 670. The gate input for the second PMOS FET is coupled to an first input signal Vin1 672, while the gate input for the third PMOS FET is coupled to an second input signal Vin2 674. The first PMOS FET 662 has its input coupled to a first clock signal Vpe 676 which is the PMOS evaluate clock. The NMOS FET 668 has its gate input coupled to a second clock signal Vnc 678, which is the NMOS charge clock. During the charge cycle, the input to FET 668 is held high (Vnc= high) thereby driving the output Vout 670 to ground.

In the preferred embodiment, the input signals Vin1 and Vin2 for a P-logic building block device are held at a steady state high level and transition to low during the evaluation period. Thereafter, the input signals are held constant through the remainder of the evaluation cycle allowing only for a single transition from the high to low state during the evaluation time period. This input restriction allows for the proper evaluation logic function and is standard for dynamic logic devices. In operation, during the evaluation cycle, the output will only transition from low to high upon both PMOS FETs 664 and 666 conducting. As such, the resultant output signal is the logical NOR of the two input signals Vin1 and Vin2.

Figure 8:
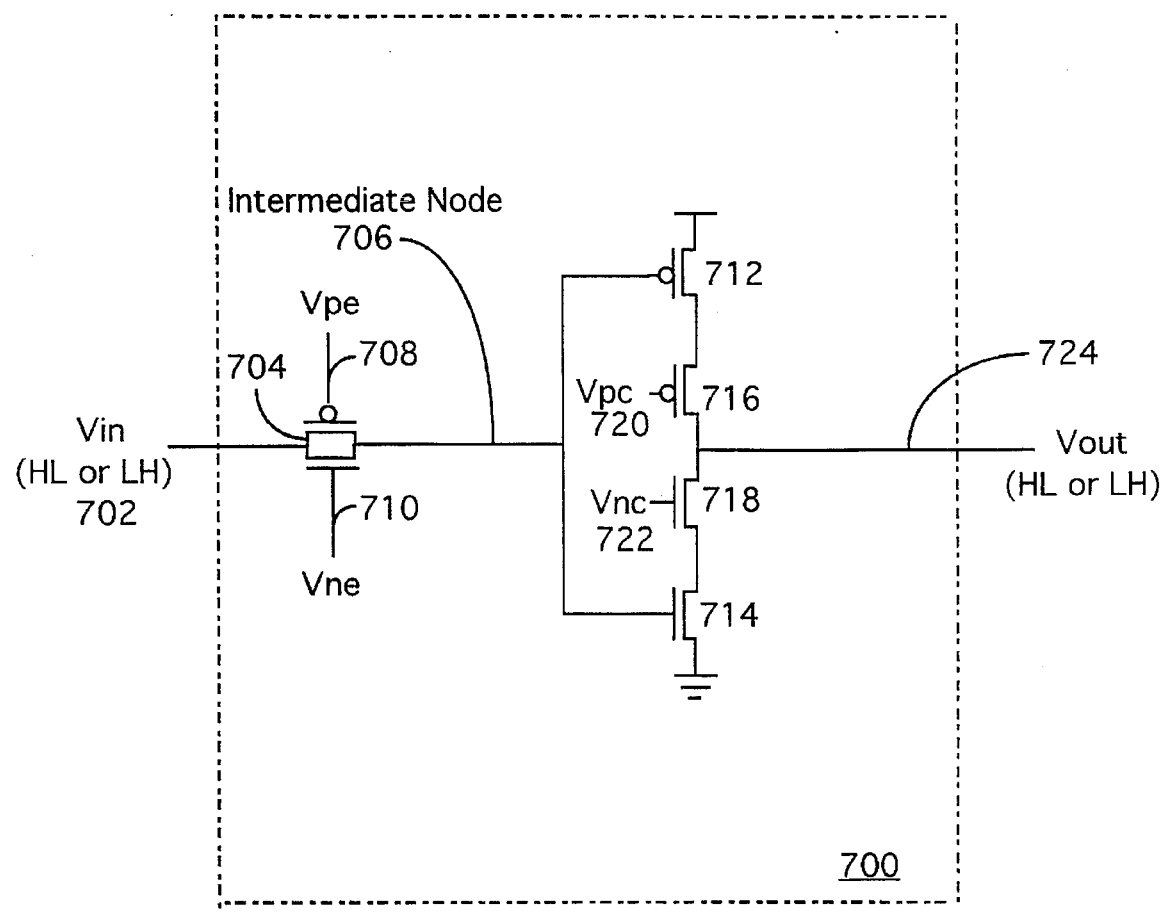
FIG. 8 shows a short circuit current free static latch according to the preferred embodiment of the present invention.

Referring now to FIG. 8, a short circuit current-free latch for use in the preferred embodiment of the present invention is shown. The dynamic latch 700 receives an input signal 702 which may be of the form of a constant high output with high to low transitions or a steady state low input signal with low to high transitions as required by a given P-logic or N-logic device. The input signal 702 is coupled through a complimentary pass gate NMOS transistor 704 which is configured to allow the input signal to pass to the intermediate stage 706 during the evaluation cycle for a given logic block. Clock signals Vpe 708 and Vne 710 drive the complimentary base inputs to the pass gate transistor such that during the evaluation cycle (when the Vpe clock signal is held low and the Vne clock signal is held high), the value of the input signal is passed to the intermediate stage 706.

The intermediate stage 706 drives the bass input of a PMOS FET 712 and an NMOS FET 714. The PMOS FET 714 has its source coupled to VCC and its drain coupled to the source input of a second PMOS FET 716. The drain of the second PMOS FET 716 is in turn coupled to the source of a second NMOS FET 718 whose drain, in turn is coupled to the source of the first NMOS FET 714. The drain of the first NMOS FET 714 is coupled to ground. Finally, the gate input to PMOS FET 716 is tied to the Vpc clocking signal 720 and the gate input to the second NMOS FET 718 is tied to the Vnc clocking signal 722. An output signal tap Vout 724 is provided between the drain and source of the second PMOS FET 716 and second NMOS FET 718.

In operation, during the evaluation of the N and P-logic blocks, the Vpe clock signal 708 is held low and the Vne clock signal 710 is held high. This allows the value of the input signal 702 to pass to the intermediate node 706. At the same time, the Vpc clock signal 720 is high and the Vnc clock signal 722 is held low, allowing the value of the output signal 724 to be unaffected by the intermediate node 706. Those ordinarily skilled in the art will recognize that because the second PMOS FET 716 and second NMOS FET 718 are disabled due to the state of the Vpc and Vnc clocking signals, the output signal 724 will be maintained in an unchanged state (either ground or logic high) due to the capacitive nature of the output port. As such, the new intermediate signal located at intermediate section 706 will have no immediate effect on the output signal 724.

Upon the termination of the evaluation cycle (Vpe transitions from low to high and Vne transitions from high to low), the pass gate transistor 704 turns off, leaving an intermediate value stored in the intermediate stage 706 due to the capacitive nature of the intermediate stage. As such, after the evaluation period is completed and the input signal switches back from a low to a high or a high to a low transition, the intermediate stage 706 is unaffected by the return to steady state of the input signal line.

As the pre-charge cycle begins, the Vpc clocking signal 720 goes low and the Vnc clocking signal 722 goes high. The intermediate value stored in the intermediate node 706 will cause either the PMOS FET 712 or the NMOS FET 714 to conduct. If the intermediate value stored in the intermediate state 706 is a logic low, the PMOS FET 712 will conduct thereby causing the output signal line 724 to reflect a high signal level (via FETs 712 and 716). Conversely, if the intermediate value stored in intermediate node 706 is a high level, the PMOS FET 712 will not turn on, and instead, the NMOS FET 714 will conduct driving a logic low or ground signal to the output signal line 724. At the end of the charge cycle, second PMOS FET 716 and second NMOS FET 718 will turn off as the clock input signal Vpc and Vnc transition back to their steady states. Those ordinarily skilled in the art will recognize that since the intermediate value stored in the intermediate node is a stable value (due to the transition of the pass gate transistor 704 to the off state), only one of the transistors 712 or 714 will be on at a given time thereby providing no short circuit current flow in the latch 700.

Again, as was described previously, care should be taken when using this particular latch due to the capacitive storage nature of the latch. The latch stores data using capacitance on the intermediate node. Stored values however, will decay after some time, so again, a minimum frequency for the clocks used in the preferred embodiment of the present invention is required. Those ordinarily skilled in the art will recognize that the input value received via the pass gate transistor 704 is transferred from the output of a particular logic block using charge sharing, that is, the capacitance of the output node of a particular logic block shares its charge with the logic block and its capacitance associated with the intermediate node. As such, the capacitance on the input signal side (the output capacitance of a particular logic block) must be significantly larger than the capacitance of the intermediate node. In the preferred embodiment of the present invention, the capacitance of the output node of a particular logic block is ten times more than the capacitance of the intermediate node in order to alleviate charge sharing problems.

As was described above, the latch stores data in its intermediate node using the capacitance of the intermediate and output nodes. This stored data may decay over time. In order to maintain the data values over a longer period of time, a keeper circuit may be employed.

Figure 9:
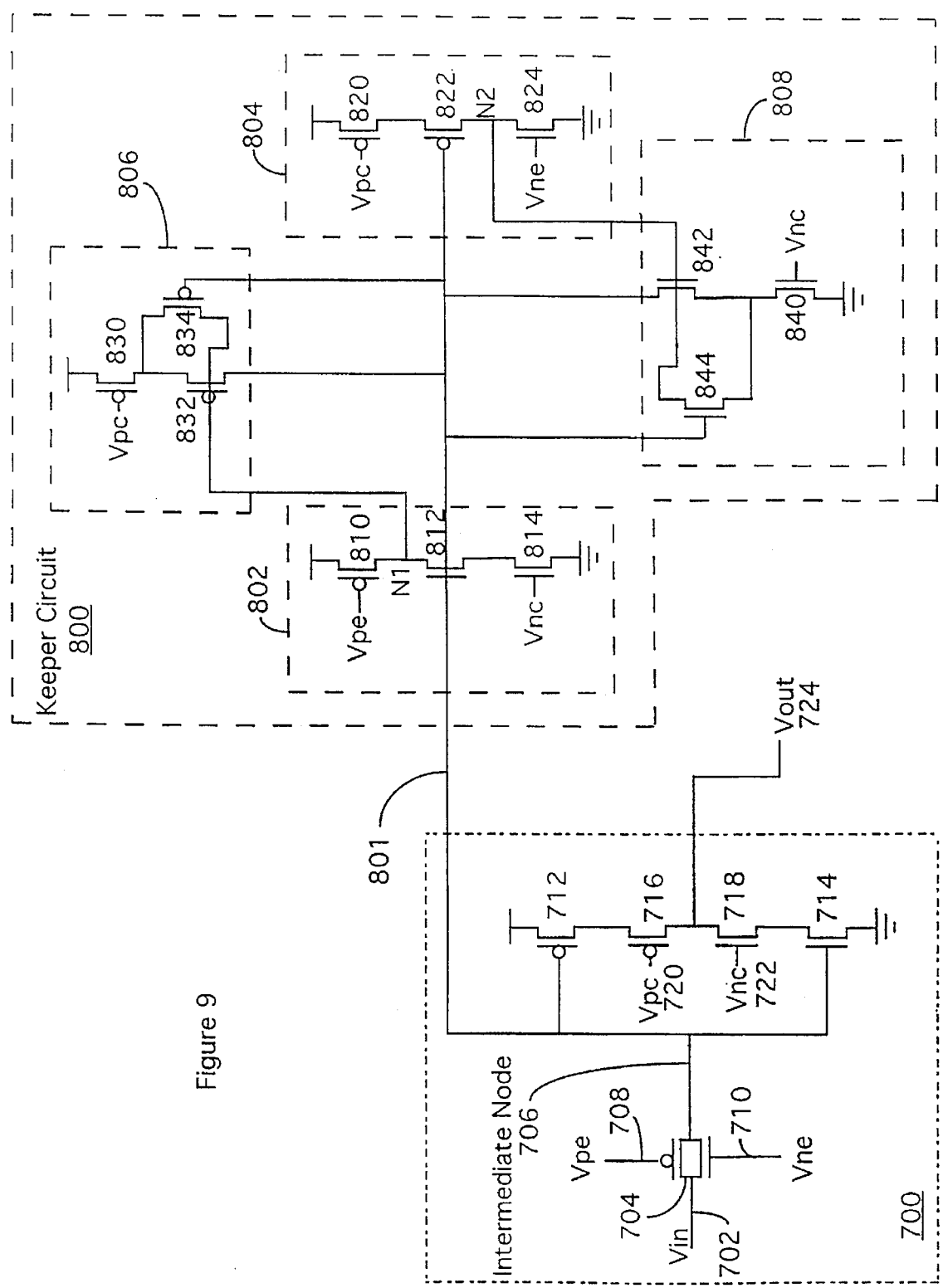
FIG. 9 shows a short circuit current free dynamic latch according to the preferred embodiment of the present invention.

Referring now to FIG. 9, a keeper circuit 800 for use in maintaining the intermediate data stored in the latch 700 of the preferred embodiment of the present invention is shown. The keeper circuit 800 is comprised of an input signal line 801 which couples the intermediate value from the intermediate node 706 associated with the latch 700 to the keeper circuit 800. The keeper circuit 800 is comprised of a high value detector 802, a low value detector 804, a logical high maintenance circuit 806 and a logical low maintenance circuit 808.

The high value detector 802 is comprised of a PMOS transistor 810 whose source is coupled to VCC and gate is coupled to the Vpe input clock signal. The drain of the PMOS transistor 810 is, in turn coupled to the source of an NMOS transistor 812 whose drain is connected to a second NMOS transistor 814. The gate for the second NMOS transistor 814 is coupled to the Vnc clocking signal while the drain of the second NMOS transistor is coupled to ground. Finally, the gate input for the first NMOS transistor 812 is coupled to receive the intermediate value from the intermediate node 706 of the dynamic latch 700 via input signal line 801.

In operation, during the evaluation period, node 1 (N1) is held high irrespective of the output values associated with the intermediate node on gate input to NMOS FET 812. During the charge cycle, node N1 is held low if the intermediate value from the latch circuit is high or conversely, node 1 is held at a logical high if the intermediate value input to the gate input of NMOS FET 812 is low.

The low level detection circuit 804 is comprised of a first PMOS FET 820 whose source is coupled to VCC and whose gate is coupled to the Vpc clocking signal. The drain of the PMOS FET 820 is coupled to a source input of a second PMOS FET 822 whose drain in turn is coupled to the source of an NMOS FET 824. The gate of the second PMOS FET is coupled to the intermediate node 706 to receive the intermediate value stored by the dynamic latch 700 via input signal line 801. Finally, the gate input of the NMOS FET 824 is coupled to the Vne clocking signal and the drain of the NMOS FET 824 is coupled to ground.

In operation, the node 2 (N2) is held at a logical low during the evaluation period due to the turn on of the NMOS FET 824, irrespective of the intermediate input value at the gate of PMOS FET 822. Conversely, during the charge cycle, node N2 is held at a logic low if the intermediate value transferred from the dynamic latch is a logic high signal and the node N2 is held at a logical high level if the intermediate value from the intermediate node of the dynamic latch 700 is a logic low.

The logic high maintenance circuit 806 is comprised of three PMOS transistors 830, 832, and 834. The source of the first PMOS transistor 834 is coupled to VCC and its gate input is coupled to the Vpc clocking signal. The drain of the first PMOS FET 830 is coupled to the source input of the second 832 and third 834 PMOS transistors, respectively. The drain of the third PMOS transistor is coupled to the gate input of the second PMOS transistor 832, which is also connected to the node 1 (N1) point of the high value detector 802. Finally, the intermediate value from intermediate node 706 is coupled to the drain input of second PMOS FET 832 and the gate input of third PMOS FET 834 via input signal line 801.

In operation, whenever the charge cycle is asserted (e.g., the Vpc clock signal is held at a logic low), then a logic high signal will be transferred onto the input signal line 801 via second PMOS FET 832. This is because during the charge cycle, node 1 will be at a logic low if the last intermediate value stored was a logical high. As such, the intermediate value will be maintained at a logical high due to PMOS transistors 830 and 832 conducting and providing a path for the VCC signal to be asserted on the intermediate value input signal line 801. Conversely, if the intermediate input value last stored by the latch 700 was a low state, third PMOS transistor 834 would conduct (due to the low level value on the gate input of PMOS transistor 834) and cause the node 1 point coupled to the gate input of second PMOS transistor 832 to be driven to a logical high, thereby not allowing the turn on of the second PMOS transistor 832. As such, when the intermediate value from intermediate node 706 is a low level, the high level maintenance circuit 806 is disabled.

Finally, the logical low level maintenance circuit 808 includes three NMOS transistors 840, 842, and 844. NMOS transistor 840 has its drain coupled to ground and gate input coupled to the Vnc clocking signal. The source of the first NMOS transistor 840 is in turn, coupled to the drain of both the second 842 and third 844 NMOS transistors. The source of the third NMOS transistor 844 is in turn, coupled to the gate input of the second NMOS transistor 842 which also is connected to the node 2 (N2) point of the low level detector circuit 804. Finally, the intermediate value input signal line 801 is coupled to the gate input of the third NMOS transistor 844 and the source of the second NMOS transistor 842.

In operation, the low level maintenance circuit provides a logical low level coupled via NMOS transistors 840 and 842 to the intermediate value input signal line 801 upon a logical low value being asserted on the intermediate node during a charge cycle. In particular, during a charge cycle, the Vnc clock signal is held high thereby causing NMOS transistor 840 to conduct providing a ground input to the drain inputs to NMOS transistors 842 and 844. If the intermediate value stored in the intermediate node 706 is a logical low level, then NMOS transistor 842 will conduct due to the high input signal at its gate input driven from node 2 of the low detector circuit 804, thereby causing a low signal to be reinforced on the intermediate value output signal line 801. Conversely, if the intermediate value received from intermediate node 706 is a high signal level, NMOS transistor 844 will conduct and drive a logical low to the gate input to NMOS transistor 842, thereby disabling NMOS transistor 842. As such, when the intermediate value from intermediate node 706 is a high level, the low level maintenance circuit 808 is disabled.

Those ordinarily skilled in the art will recognize that the keeper circuit is also short circuit current free because no PMOS or NMOS stages will be on concurrently in any cascaded leg of the keeper circuit. This is true because of the different cycling of the clocking signals during the evaluation and the charge cycles. Those ordinarily skilled in the art will also recognize that by maintaining the charge state (e.g., maintaining the Vnc and Vpc signals in the enabled state), the keeper circuit 800 will maintain the last intermediate value stored at intermediate node 706 for as long as the Vpc and Vnc circuits are asserted.

In order to better understand the operation of the keeper circuit 800, an evaluation of circuit operation during the various clock cycles is provided.

Prior to the evaluation cycle, Vpc and Vpe clocking signals are high while the Vnc and Vne clocking signals are in a low state. As the evaluation cycle commences, the Vpe clocking signal goes low and the Vne clocking signal goes high thereby pre-charging node N1 in the high intermediate value detector 802 to a high logic level and node 2 in the low intermediate value detector 804 to a logic low. This forces transistors 832 and 842 to turn off. As such, the value of the intermediate node has no affect on the keeper during this time period.

After the evaluation cycle is complete, then the Vpe clock signal goes high and the Vne clock signal goes low causing the value of the input signal 702 from the dynamic latch 700 to be stored as an intermediate value at intermediate node 706. As was described previously, the intermediate value is stored by the capacitance of the intermediate node. Again, the keeper circuit remains unchanged during this cycle having no affect on the keeper circuit due to the disabled state of the drive PMOS and NMOS transistors in the keeper circuit (810, 814, 820, 824, 830, and 840).

As the pre-charge cycle begins, the Vpc clocking signal goes low and the Vnc clocking signal goes high. The value of the intermediate node is maintained by the capacitance associated with the intermediate node and can be used by the keeper circuit as described above. When the value of the intermediate node is high, node N1 in the high value detector circuit 802 will be discharged to low by the NMOS path of the high value detector circuit (NMOS transistors 812 and 814). This will in turn, turn transistor 832 on and a high value will be driven on to the intermediate signal input line 801, and, accordingly, onto the intermediate node 706. If the intermediate value during pre-charge is low, node N2 of the low value detector circuit 804 will be discharged to high by the PMOS path of the low value detector circuit 804 (PMOS transistors 820 and 822). This will in turn, cause transistor 842 to conduct and a low value will be driven on to the intermediate node 706 by means of the intermediate signal line 801.

Those ordinarily skilled in the art will recognize that the intermediate value stored in the intermediate node of dynamic latch 700 is transferred to the keeper circuit by means of a charge sharing principle. However, the decaying nature of the capacitive value stored in the intermediate node is compensated for by the maintenance circuits 806 and 808 of the keeper circuit, such that as long as the charge dock signals Vpc and Vnc are maintained enabled, the last value for the intermediate node will be maintained awaiting the end of the charge cycle and the beginning of a new evaluation cycle.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A short circuit current and glitch free logic building block comprising:

a NP domino logic building block having an input and an output, said input receiving a first input signal in a first input state;

a clock circuit for generating a charge clock signal and an evaluation clock signal, said charge clock signal being asserted during a charge cycle of said block for pre-charging said NP domino logic building block output to a first output state, said evaluation clock signal being asserted during an evaluation cycle of said block for evaluating said first input signal on said input and for driving said NP domino logic building block output to a second output state upon the transition of said first input signal from said first input state to a second input state during said evaluation cycle, said clock circuit being configured such that neither said charge clock signal nor said evaluation clock signal are asserted simultaneously; and a short circuit current free latch for conditioning said first input signal prior to input to said NP domino logic building block, said latch comprising an input port for receiving said first input signal, an intermediate node for storing an intermediate signal value portion of said first input signal and an output port for coupling said intermediate signal value to said NP domino logic building block, said latch holding said intermediate signal value of said first input signal at a steady state over said evaluation cycle and said charge cycle of said block by latching and delaying said first input signal at said intermediate node until the next evaluation cycle of said building block.

2. The apparatus of claim 1, further including a short circuit current free keeper circuit for maintaining said intermediate value signal portion in said intermediate node until a next evaluation cycle is asserted in said building block.

3. The apparatus of claim 2, wherein said keeper circuit includes a low value detector, a high value detector, low value maintenance circuitry and high value maintenance circuitry, said low and high value detectors being coupled to said intermediate node for detecting said intermediate value signal portion during said evaluation cycle of said building block, said keeper circuit being responsive to said charge clock signal such that during said building block charge cycle, said keeper circuit low and high value maintenance circuitry refresh said intermediate value signal portion on said intermediate node prior to decay of said intermediate signal portion.

4. A cascaded domino logic circuit comprising:

at least one N-logic building block having a first input receiving a first input signal in a first input state and a first output;

at least one P-logic building block having a second input receiving a second input signal in a second input state and a second output;

said at least one N-logic building block and said at least one P-logic building block being connected output-to-input in linear unbranched cascade fashion with an N-logic building block alternating with a P-logic building block in said cascade;

a clock circuit generating an N-logic block charge clock signal and separate N-logic block evaluation clock signal, and a P-logic block charge clock signal and separate P-logic block evaluation clock signal;

said N-logic charge clock signal being asserted during a charge cycle of said N domino logic building block for pre-charging said N domino logic building block output to a first output state, said N-logic evaluation clock signal being asserted during an N-logic block evaluation cycle of said N domino logic building block for evaluating said first input signal on said input and for driving said N domino logic building block output to a third output state upon the transition of said first input signal from said first input state to a third input state during said N-logic block evaluation cycle, said clock circuit being configured such that neither said N-logic block charge clock signal nor said N-logic block evaluation clock signal are asserted nor in transition simultaneously thereby providing separate non-overlapping and non-intersecting N-logic block precharge and evaluation cycles;

said P-logic charge clock signal being asserted during a charge cycle of said N domino logic building block for pre-charging said N domino logic building block output to a first output state, said P-logic evaluation clock signal being asserted during an P-logic block evaluation cycle of said N domino logic building block for evaluating said second input signal on said input and for driving said N domino logic building block output to a fourth output state upon the transition of said second input signal from said second input state to a fourth input state during said P-logic block evaluation cycle, said clock circuit being configured such that neither said P-logic block charge clock signal nor said P-logic block evaluation clock signal are asserted nor in transition simultaneously thereby providing separate non-overlapping and non-intersecting P-logic block pre-charge and evaluation cycles.

5. The apparatus of claim 4, wherein said at least one N-logic building block comprises a plurality of N-logic building blocks.

6. The apparatus of claim 5, wherein said at least one P-logic building block comprises a plurality of P-logic building blocks.

7. The apparatus of claim 4, further comprising a short circuit current free latch for conditioning said first input signal prior to input to one of said N-logic or P-logic domino logic building block, said latch comprising an input port for receiving said an input signal, an intermediate node for storing an intermediate signal value portion of said input signal and an output port for coupling said intermediate signal value to said domino logic building block, said latch holding said intermediate signal value of said input signal at a steady state over an evaluation cycle for said logic block and said charge cycle of said block by latching and delaying said input signal at said intermediate node until the next evaluation cycle of said logic building block.

8. The apparatus of claim 7, further including a short circuit current free keeper circuit for maintaining said intermediate value signal portion in said intermediate node until a next evaluation cycle is asserted in said building block.

9. The apparatus of claim 8, wherein said keeper circuit includes a low value detector, a high value detector, low value maintenance circuitry and high value maintenance circuitry, said low and high value detectors being coupled to said intermediate node for detecting said intermediate value signal portion during said evaluation cycle of said building block, said keeper circuit being responsive to said charge clock signal such that during said building block charge cycle, said keeper circuit low and high value maintenance circuitry refresh said intermediate value signal portion on said intermediate node prior to decay of said intermediate signal portion.

10. The apparatus of claim 4, wherein said logic blocks are cascaded without intervening static inverters between each of said blocks.

* * * * *